(12) United States Patent
Apelsmeier et al.

(10) Patent No.: US 12,408,309 B2
(45) Date of Patent: Sep. 2, 2025

(54) SYSTEMS AND METHODS FOR A MULTI-FUNCTIONAL STRUCTURAL ELEMENT OF AN INVERTER

(71) Applicant: BorgWarner US Technoloqies LLC, Wilmington, DE (US)

(72) Inventors: Andreas Apelsmeier, Pollenfeld (DE); Chetan Ugare, Nuremberg (DE); Stefan Berindan, Nuremberg (DE)

(73) Assignee: BorgWarner US Technologies, LLC, Wilmington, DE (US)

( * ) Notice: Subject to any disclaimer, the term of this patent is extended or adjusted under 35 U.S.C. 154(b) by 258 days.

(21) Appl. No.: 18/334,199

(22) Filed: Jun. 13, 2023

(65) Prior Publication Data

US 2024/0422951 A1    Dec. 19, 2024

(51) Int. Cl.
*H05K 7/20* (2006.01)
*H02M 7/00* (2006.01)
*H05K 7/14* (2006.01)

(52) U.S. Cl.
CPC ............ *H05K 7/209* (2013.01); *H02M 7/003* (2013.01); *H05K 7/1427* (2013.01)

(58) Field of Classification Search
CPC ............ H05K 7/1427; H05K 7/20154; H05K 7/20218; H05K 7/20254; H05K 7/20263; H05K 7/2039; H05K 7/20409; H05K 7/20509; H05K 7/20854; H05K 7/209; H05K 7/20927; H05K 1/0203; H05K 1/0209; H05K 1/0272; H05K 1/181; H05K 2201/064; H01L 23/36; H01L 23/3677; H01L 23/40; H01L 23/473
See application file for complete search history.

(56) References Cited

U.S. PATENT DOCUMENTS 10,420,256 B1 * 9/2019 Nakamura ......... H05K 7/20927
10,461,657 B2 * 10/2019 Nakamura ......... H05K 7/20936
(Continued)

FOREIGN PATENT DOCUMENTS

DE    102015213164 A1    1/2017
DE    102019200011 A1 *  7/2020

OTHER PUBLICATIONS

DE-102019200011-A1 English Translation (Year: 2019).*

*Primary Examiner* — Amir A Jalali
(74) *Attorney, Agent, or Firm* — Joshua M. Haines; Bookoff McAndrews, PLLC (57) ABSTRACT

An inverter including: a housing including a first surface and a second surface opposite to the first surface; a power module including a first surface and a second surface opposite to the first surface, wherein the first surface of the power module contacts the first surface of the housing; a heat sink including a first surface and a second surface opposite to the first surface, wherein the first surface of the heat sink is coupled to the second surface of the power module; a multi-functional structural element, the multi-functional structural element including a first surface and a second surface, wherein the first surface of the multi-functional structural element contacts the second surface of the heat sink; and a printed circuit board, the printed circuit board being coupled to the second surface of the multi-functional structural element; wherein the housing and heat sink define a cooling circuit.

20 Claims, 8 Drawing Sheets

(56) References Cited

U.S. PATENT DOCUMENTS

| | | | |
|---|---|---|---|
| 2003/0184969 A1* | 10/2003 | Itabashi | H01L 23/3675 |
| | | | 361/688 |
| 2014/0198449 A1* | 7/2014 | Osada | H01L 24/34 |
| | | | 361/689 |
| 2015/0289411 A1* | 10/2015 | Kamiya | H05K 7/20263 |
| | | | 361/701 |
| 2018/0082925 A1* | 3/2018 | Grassmann | H01L 23/42 |
| 2019/0371705 A1 | 12/2019 | Yamauchi et al. | |
| 2020/0214180 A1* | 7/2020 | Kobayashi | H01L 23/473 |
| 2021/0274690 A1 | 9/2021 | Cho et al. | |
| 2023/0335456 A1* | 10/2023 | Santolaria | H01L 23/3675 |
| 2024/0155819 A1* | 5/2024 | Lee | H05K 9/0022 |

* cited by examiner

SYSTEMS AND METHODS FOR A MULTI-FUNCTIONAL STRUCTURAL ELEMENT OF AN INVERTER

TECHNICAL FIELD

Various embodiments of the present disclosure relate generally to an inverter systems, and, more particularly, to systems and methods for a multi-functional inverter structural element.

INTRODUCTION

An inverter system may include a power module, inverter housing, and a printed circuit board ("PCB"). Thermal load management of an inverter system may be necessary to improve performance and reliability of the system. Cooling circuits may be used to transfer heat from the power module in order to cool the power module. Separately, thermal vias or passive cooling through an inverter housing may be used to cool the PCB. Improper cooling of the PCB or power module may lead to improper operations of the inverter system.

The present disclosure is directed to overcoming one or more of these above-referenced challenges.

SUMMARY OF THE DISCLOSURE

In some aspects, the techniques described herein related to an inverter including: a housing including a first surface and a second surface opposite to the first surface; a power module including a first surface and a second surface opposite to the first surface, wherein the first surface of the power module contacts the first surface of the housing; a heat sink including a first surface and a second surface opposite to the first surface, wherein the first surface of the heat sink is coupled to the second surface of the power module; a multi-functional structural element, the multi-functional structural element including a first surface and a second surface opposite to the first surface, wherein the first surface of the multi-functional structural element contacts the second surface of the heat sink; and a printed circuit board, the printed circuit board being coupled to the second surface of the multi-functional structural element; wherein the housing and heat sink define a cooling circuit, the cooling circuit including a first cooling channel and a second cooling channel, the first cooling channel being defined by a space in the housing and the second cooling channel being defined by inner walls of the heat sink.

In some aspects, the techniques described herein related to an inverter, wherein the multi-functional structural element is coupled to the heat sink by a thermal interface material.

In some aspects, the techniques described herein related to an inverter, wherein the multi-functional structural element is coupled to the heat sink by a hermetic seal.

In some aspects, the techniques described herein related to an inverter, wherein the multi-functional structural element is metal.

In some aspects, the techniques described herein related to an inverter, wherein the multi-functional structural element does not directly contact the cooling circuit.

In some aspects, the techniques described herein related to an inverter, wherein the heat sink is a diecast heat sink or sheet metal heat sink.

In some aspects, the techniques described herein related to an inverter, wherein the multi-functional structural element includes a first plane, the first plane being a recess within the first surface of the multi-functional structural element, the recess being configured to receive the heat sink.

In some aspects, the techniques described herein related to an inverter, wherein an air gap exists between the printed circuit board and an external cover of the housing.

In some aspects, the techniques described herein related to an inverter, wherein the multi-functional structural element includes a fixation point capable of receiving a screw, the screw being configured to secure the printed circuit board and the multi-functional structural element to the housing.

In some aspects, the techniques described herein related to an inverter, wherein the multi-functional structural element has a geometric cross section greater than the power module.

In some aspects, the techniques described herein related to an inverter, wherein the multi-functional structural element is configured to completely cover the printed circuit board from an electromagnetic field projected from the power module.

In some aspects, the techniques described herein related to an inverter, wherein the multi-functional structural element includes a second plane that protrudes from the second surface of the multi-functional structural element and contacts the printed circuit board, wherein the second plane is configured to receive heat from the printed circuit board.

In some aspects, the techniques described herein related to an inverter including: a housing including a first surface and a second surface opposite to the first surface; a power module including a first surface and a second surface opposite to the first surface, wherein the first surface of the power module contacts the first surface of the housing; a heat sink including a first surface and a second surface opposite to the first surface, wherein the first surface of the heat sink is coupled to the second surface of the power module; a multi-functional structural element, the multi-functional structural element including a first surface and a second surface opposite to the first surface, wherein the first surface of the multi-functional structural element contacts an outer wall of the heat sink, wherein the multi-functional structural element has a geometric cross section greater than the power module; and a printed circuit board, the printed circuit board being coupled to the second surface of the multi-functional structural element, wherein the multi-functional structural element is configured to completely cover the printed circuit board from an electromagnetic field projected from the power module; wherein the housing and heat sink define a cooling circuit, the cooling circuit including a first cooling channel and a second cooling channel, the first cooling channel being defined by a space in the housing and the second cooling channel being defined by inner walls of the heat sink.

In some aspects, the techniques described herein related to an inverter, wherein the multi-functional structural element is coupled to the heat sink by a thermal interface material.

In some aspects, the techniques described herein related to an inverter, wherein the multi-functional structural element is coupled to the heat sink by a hermetic seal.

In some aspects, the techniques described herein related to an inverter, wherein the multi-functional structural element is metal.

In some aspects, the techniques described herein related to an inverter, wherein the multi-functional structural element does not directly contact the cooling circuit.

In some aspects, the techniques described herein related to an inverter, wherein the multi-functional structural element includes a first plane, the first plane being a recess within the first surface of the multi-functional structural element, the recess being configured to receive the heat sink.

In some aspects, the techniques described herein related to an inverter, wherein the multi-functional structural element includes a second plane that protrudes from the second surface of the multi-functional structural element and contacts the printed circuit board, wherein the second plane is configured to receive heat from the printed circuit board.

In some aspects, the techniques described herein related to a multi-functional structural element for an inverter, the element including: a first plane with a first surface and a second surface opposite to the first surface, the multi-functional structural element further including a second plane and a third plane, the second plane being a rectangular recess within the first surface of the first plane, the second plane being configured to receive and transfer heat to a heat sink, the third plane being a protrusion from the second surface of the first plane, the third plane being configured to contact a printed circuit board and configured to transfer heat from the printed circuit board to the first plane.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to an inverter system, and more particularly to, to systems and methods for a multi-functional inverter structural element.

Inverters, such as those used to drive a motor in an electric vehicle, for example, are responsible for converting High Voltage Direct Current ("HVDC") into Alternating Current ("AC") to drive a motor. Inverters may include a housing, a power module, a printed circuit board ("PCB"), and a cooling circuit. Power module may include one or more silicon carbide ("SiC")-based power switches that deliver relatively high power densities and efficiencies needed to extent battery range and performance. The power module may contain circuitry and components that are configured to convert DC current from the electric vehicle battery to AC current, which can be utilized within the electric motor that drives the propulsion system. The housing of an inverter may structurally connect the components of the inverter together. The PCB may include control and gate driver boards. The control and gate driver boards may further include active components such as power supplies, active discharge, and gate drivers. The cooling circuit of the inverter may transfer waste heat (e.g., heat generated while in operation) from the system to a coolant associated with the fluid circuits and transfer the fluid to a radiator, heat exchanger, or other engine components, as described herein.

Inverter systems may have high ambient temperature during operation. Cooling inverter systems may help improved performance and reliability. Some inverter systems utilize conventional thermal management methods to cool the active components of the PCB. These methods may include cooling the PCB through thermal vias in a copper plane connected to the PCB or by passive cooling through the housing of the inverter. Cooling the PCB through thermal vias may not provide significant cooling and may require oversizing of PCB components. Passive cooling of the PCB by the inverter housing may increase the complexity and cost of assembling inverter housing components (e.g., the inverter cover). Some inverter cooling systems may include individual cooling elements for the various components of a PCB. Some inverter systems may include power modules with double sided cooling performed by two coolant channel covers. The double coolant channels may offer no secondary benefits. Some inverter systems may have no active cooling for PCB components.

Some inverter systems may mount a PCB to inverter housing by using screws. The screw mounts may cause structural inverter integrity concerns. Some inverter systems may include PCB fixation points connected directly to an inverter housing.

Some inverter systems may include an EMC shield to protect noise coupling from an AC switching side of the power module and the PCB.

One or more embodiments of the system described herein may provide thermal management of the power module with multiple cooling elements, thermal management of active components of the control and gate driver board, and thermal management of the inner temperature of the inverter.

One or more embodiments may provide an inverter system that includes flexible mounting positions of the PCB. The flexible mount positions of the PCB may be capable of meeting different mechanical shock and vibration system requirements.

One or more embodiments may provide an inverter structural element within the inverter system capable of Electromagnetic (EMC) shielding of PCB components such as the control and gate driver board.

One or more embodiments may the decrease the complexity and cost of assembling inverter housing components (e.g., an inverter cover).

One or more embodiments may include a multi-functional structural element ("MFSE") within an inverter system. As will be described in greater detail below, the MFSE may be configured to dissipate heat from the active components (e.g., power supplies, active discharge, gate drivers) from the control and gate driver boards of the PCB. This active cooling of the PCB may lead to improved reliability and allow for more cost-effective sizing of PCB components. The MFSE may be configured to enable heat transfer from a first side in contact with a PCB and a second side in contact with a heat sink including a cooling channel. The MFSE may be configured to reduce the inner inverter temperature through the heat transfer capabilities. The MFSE may be utilized in combination with double side cooled power switches to enable efficient cooling of the inverter components while easing the assembly process. For example, one of the coolant channels utilized to cool the power switches may be used, in combination with the MFSE to cool the PCB.

The MFSE may be utilized as a structural element within an inverter system and be configured to fixate to the PCB. The fixation may allow for fixation points to be placed at optimal positions to reduce mechanical PCB stress and minimize scrappage. For example, fixation points may be located at the four corners of the MFSE as well as at additional locations such as adjacent to raised planes of the MFSE. Some fixation points may allow for fixation of the MFSE to the housing and PCB. Other fixation points may only fixate the MFSE to the PCB. The MFSE may be a separate mountable element that may be mounted to a coolant channel with a thermal interface material ("TIM"), by a hematic seal, or by a seal and screws.

The MFSE may be configured to provide EMC shielding for the control and gate driver boards of the PCB from the power module of the inverter.

Figure 1:
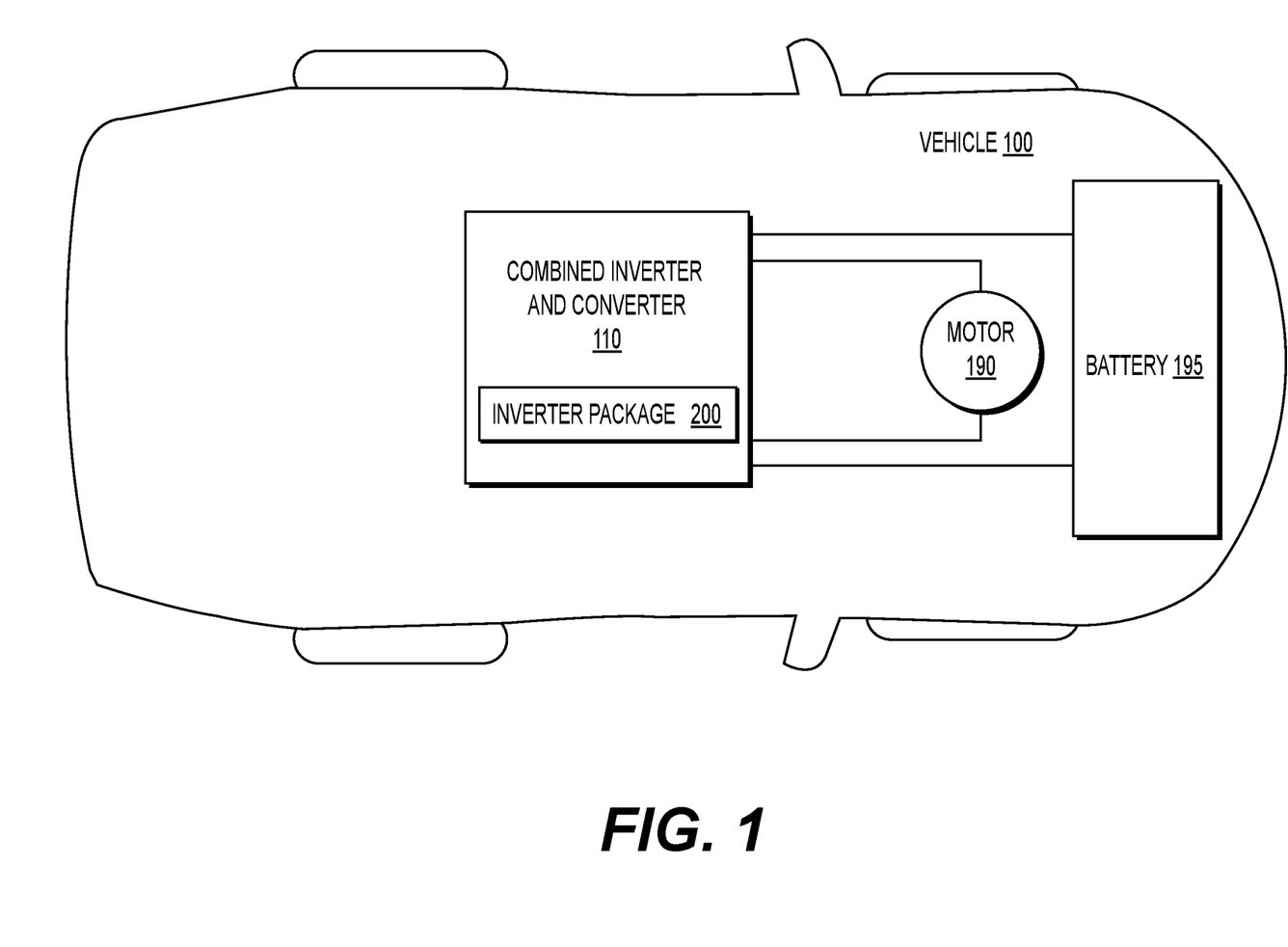
FIG. 1 depicts an exemplary system infrastructure for a vehicle including a combined inverter and converter including an inverter package system, according to one or more embodiments.

FIG. 1 depicts an exemplary system infrastructure for a vehicle including a combined inverter and converter including an inverter package system, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may include an inverter package 200. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
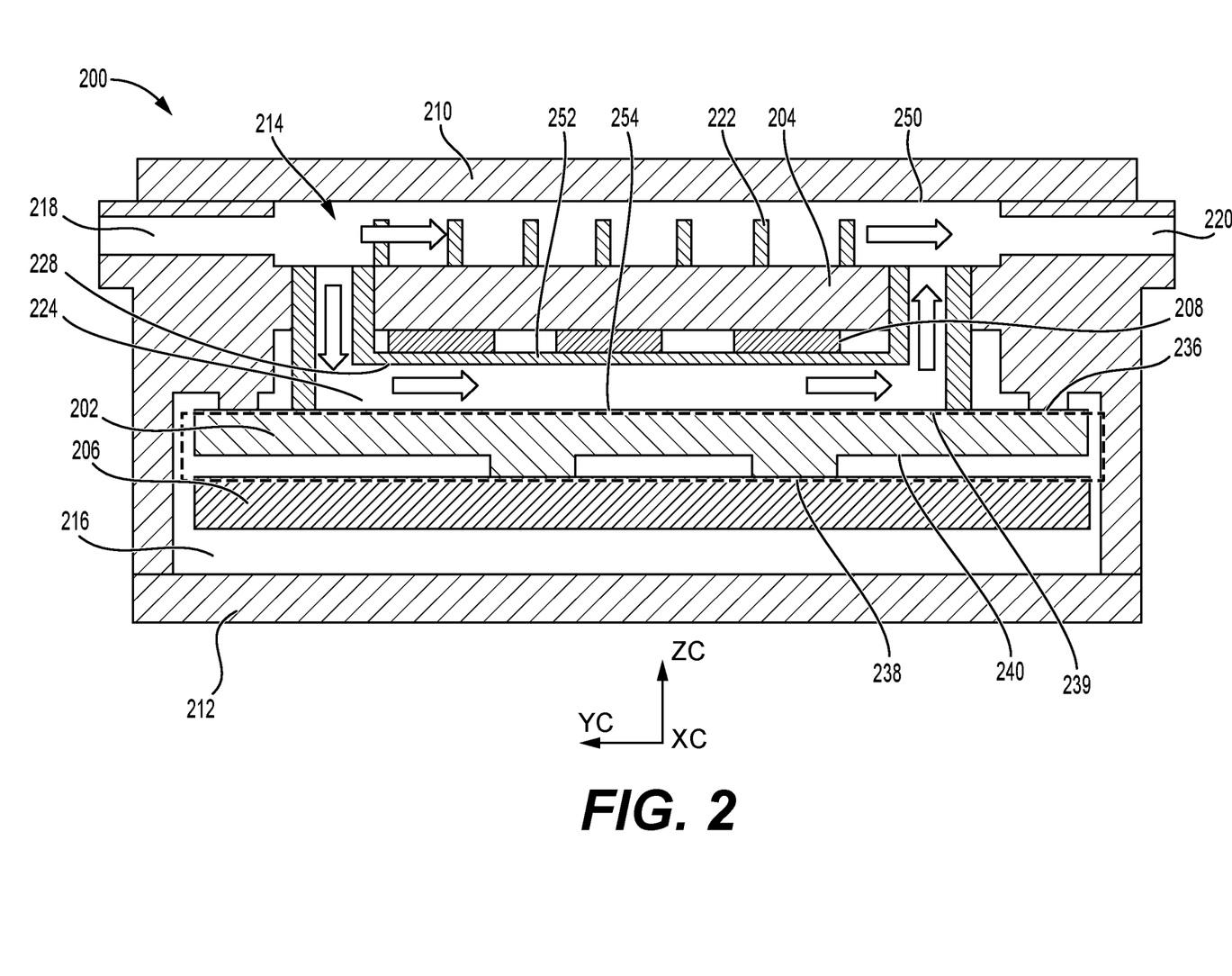
FIG. 2 depicts an exemplary inverter package including a multi-functional inverter structural element, according to one or more embodiments.

FIG. 2 depicts an exemplary inverter package 200 including a multi-functional inverter structural element ("MFSE") 202, according to one or more embodiments. The inverter package 200 may include an inverter housing 204, a MFSE 202, a printed circuit board ("PCB") 206, and a power module 208 (e.g., one or more power module, e.g., three power modules, e.g., six power modules). The inverter package 200 may include a first cover 210, a second cover 212, a cooling circuit 214, and an open space 216. The inverter housing may be configured to secure the power module 208, the MFSE 202, the cooling circuit 214, and the PCB 206. The first cover 210 may be located at a first top end of the inverter package 200 and the second cover 212 may be located at a second bottom end opposite of the first cover 210. The open space 216 (e.g., gap) may be located within the inverter housing 204 between the second cover 212 and the PCB 206. The open space 216 may include elements mounted to the PCB 206.

The cooling circuit 214 may include an inlet 218, an outlet 220, a first side cooling channel 222, and a second side cooling channel 224. The cooling circuit 214 may transfer waste heat (e.g., heat generated while in operation) from the inverter package 200 to a coolant flowing through the cooling circuit 214 and transfer the fluid to a radiator, heat exchanger, or other engine components. The flow of the coolant may be indicated by the arrows in the cooling circuit 214. The inlet 218 may be located at a third end of the inverter package 200, perpendicular to the first and second end. The outlet 220 may be located at a fourth end of the inverter package 200, also perpendicular to the first and second end, and located on the opposite side of the third end. The inlet 218 may be configured to receive a coolant into the cooling circuit 214 and the outlet 220 may expel the coolant from the cooling circuit 214. The first side cooling channel 222 may be defined by a hollow opening within the inverter housing 204 and the first cover 210 of inverter housing 204. Thus, a wall defining the hollow opening in the inverter housing 204 and a portion 250 of the surface of the first cover 210 may define the first side cooling channel 222. The connection of the portion 250 and the section of the inverter housing 204 defining the first side cooling channel 222 may be a hermetic seal. A hermetic seal may be a stir friction welding seal, an ultra-sound welding seal, a soldering seal, or a gasket seal.

Figure 4A:
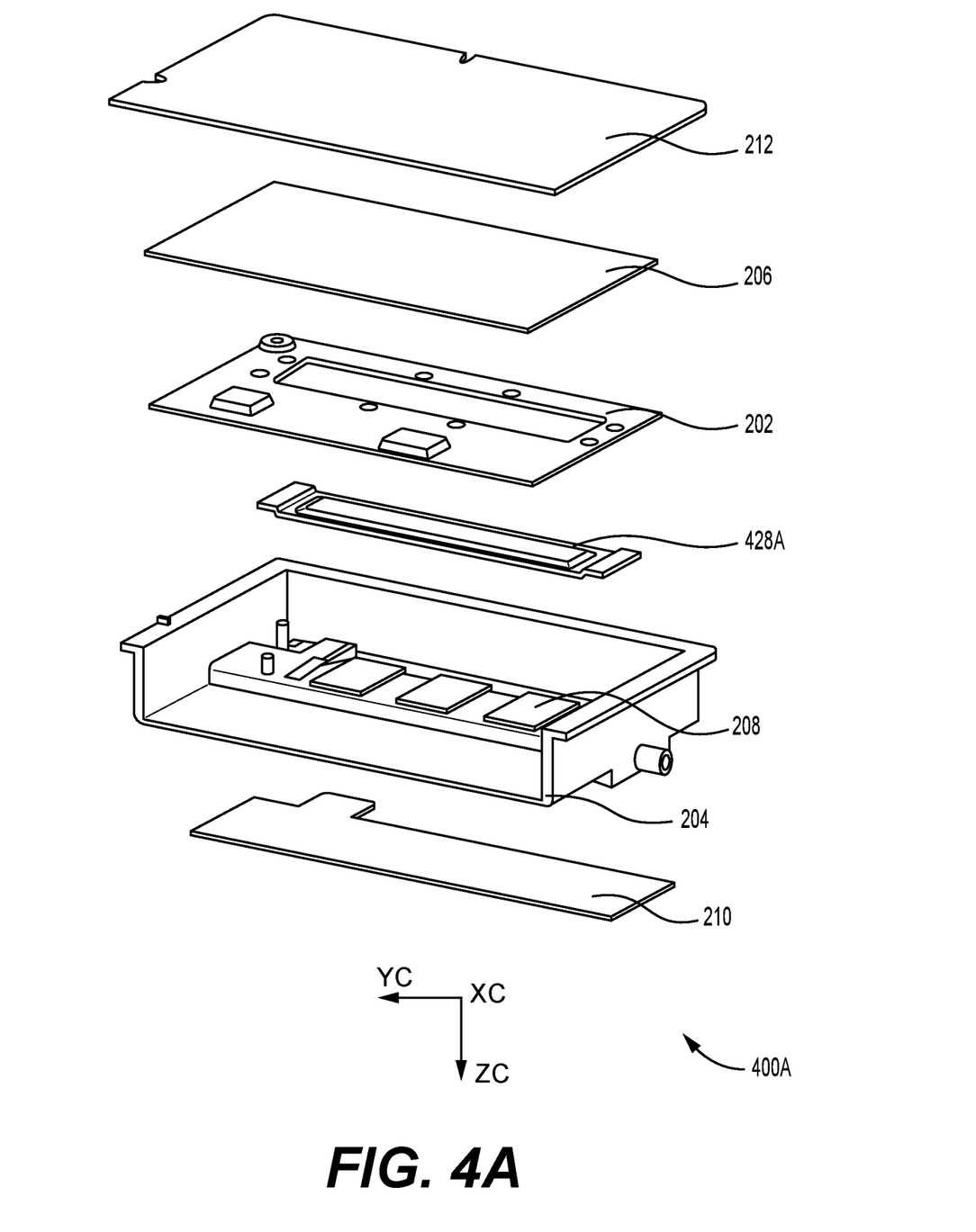
FIG. 4A depicts an exemplary inverter package including a multi-functional inverter structural element connected to a sheet metal heat sink by welding, according to one or more embodiments.
Figure 4B:
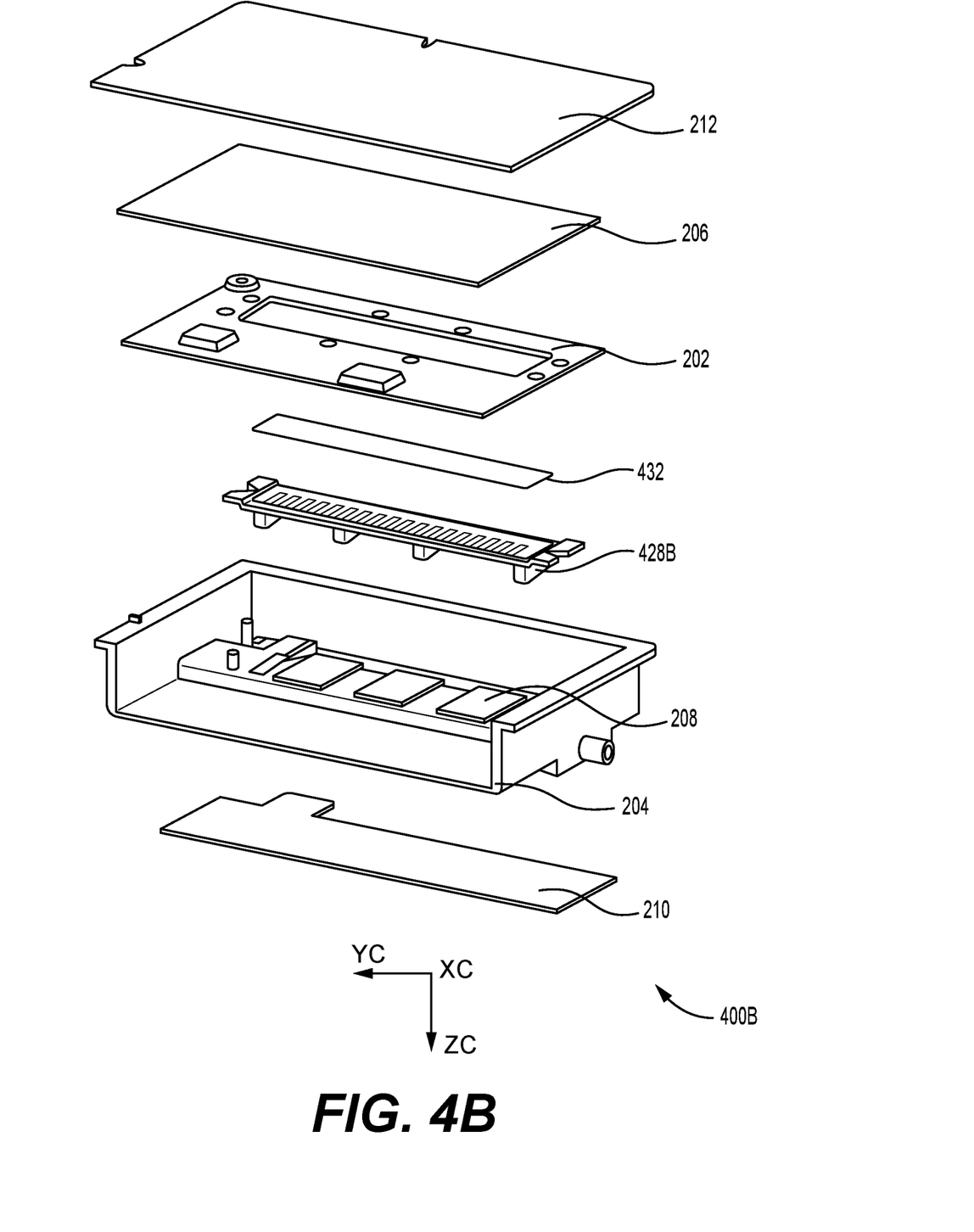
FIG. 4B depicts an exemplary inverter package including a multi-functional inverter structural element connected to a diecast heat sink by a seal and screws, according to one or more embodiments.
Figure 4C:
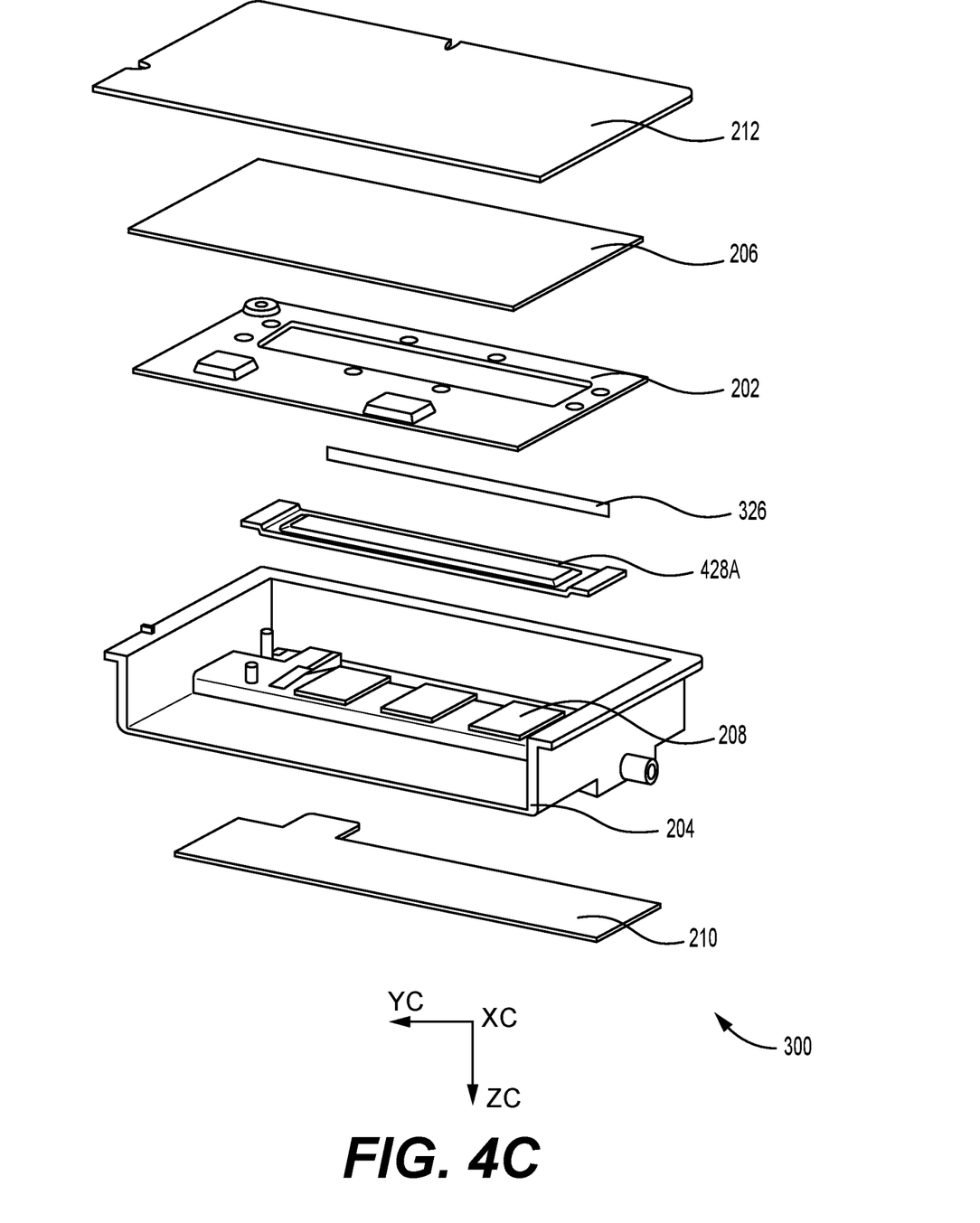
FIG. 4C depicts an exemplary inverter package including a multi-functional inverter structural element connected to a sheet metal heat sink by a thermal interface material, according to one or more embodiments.

The second side cooling channel 224 may be defined by a heat sink 228 having a hollow interior. The hollow interior of heat sink 228 may be configured to allow coolant to flow from a first end of heat sink 228 across the YC axis to a second end of heat sink 228. The heat sink 228 may have a first surface 252 and a second surface 254 opposite of the first surface 252. The first surface 252 of heat sink 228 may be in contact with the power modules 208. The first surface 252 of heat sink 228 may be coupled to the power modules 208 by a thermal interface material. The heat sink 228 may be a sheet metal heat sink 428A (as depicted in FIGS. 4A and 4C) or a diecast heat sink 428B (as depicted in FIG. 4B).

Portions of the inverter housing 204 may transfer heat to a coolant within the first side cooling channel 222. The power module 208 along with portions of the inverter housing 204 may transfer heat to a coolant within the second side cooling channel 224 through the heat sink 228.

The second surface of the heat sink 228 may be connected to the first surface of the power module 208 and to the MFSE 202 by a hermetic seal.

The MFSE 202 may include a first surface 239 and a second surface 240, the first surface 239 being opposite to the second surface 240. A first plane 544 (shown in FIG. 5) of the first surface 239 of the MFSE 202 may contact and receive the heat sink 228. The first plane 544 may be a planar section that is a recess in the first surface 239. The recess may be along the ZC axis. The heat sink 228 and first plane 544 connection may include a hermetic seal. The first plane 544 may be generally rectangular and indented to match and receive the heat sink 228. The first plane 544 (shown in FIG. 5) may be capable of receiving heat from the rest of the MFSE 202 and transferring the heat to the heat sink 228 and then to the second side cooling channel 224. The MFSE 202 in combination with the first side cooling channel 222 and second side cooling channel 224 may enable efficiently cooling over the inverter components.

The first surface 239 of the MFSE 202 may contact portions of inverter housing 204 at a fixation point 236 (e.g., one or more fixation points, e.g., two fixations points, e.g., at least three fixation points). Fixation point 236 may extend through the first surface 239 to the second surface 240 of the MFSE 202. The fixation point 236 may include a threaded opening configured to allow for a screw to connect the MFSE 202 and PCB 206 to the inverter housing 204. This fixation point 236 may reduce mechanical PCB 206 stress. For example, the fixation point 236 may increase support for the PCB 206, lowering the mechanical stress. The MFSE 202 may be made of a more rigid material in comparison to the PCB 206. The fixation point 236 coupling the PCB 206 to the MFSE 202 may decrease the bending of the PCB 206 during use of the inverter package 200.

The second surface 240 of the MFSE 202 may contact and connect to a first surface of the PCB 206 at a fixation point 236. The fixation point 236 may be located at optimal position so as to reduce the mechanical PCB 206 stress and minimize scrappage during use of the inverter package 200. For example, there may be a fixation point 236 at each of the four corners of the MFSE 202. The fixation point 236 may allow for a screw to extend from the PCB 206, through the MFSE 202 and screw into the housing 204 (shown in FIG. 5). Additional fixation points 546 (shown in FIG. 5) may be located adjacent to each second plane 238. The additional fixation points 546 may couple the MFSE 202 to the PCB 206, but not couple to the housing 204. In some embodiments, the PCB 206 may only be in contact the MFSE 202 and the PCB 206 may not directly contact the inverter housing 204 or the second cover 212. The second surface 240 of the MFSE 202 may further contact the PCB 206 at a second plane 238 (e.g., one or more second planes, e.g., two second planes). The second plane 238 may protrude from the second surface of the MFSE 202 in the ZC axis. The second plane 238 may extend further in the ZC axis than the first plane 544. The second plane 238 may be capable of receiving heat from the PCB 206 and transferring the heat through the MFSE 202 to the heat sink 228. For example, this may performed by transfer of heat from the PCB 206, through second plane 238, to a first plane 544 (depicted in FIG. 5), through the first plane 544 (in the ZC axis direction) to the heat sink 228, to the second side cooling channel 224.

An open space 216 may be located between a second surface of the PCB 206 and the second cover 212, the second surface of the PCB 206 being opposite of the first surface of the PCB 206. The open space 216 may not include air.

Figure 2A:
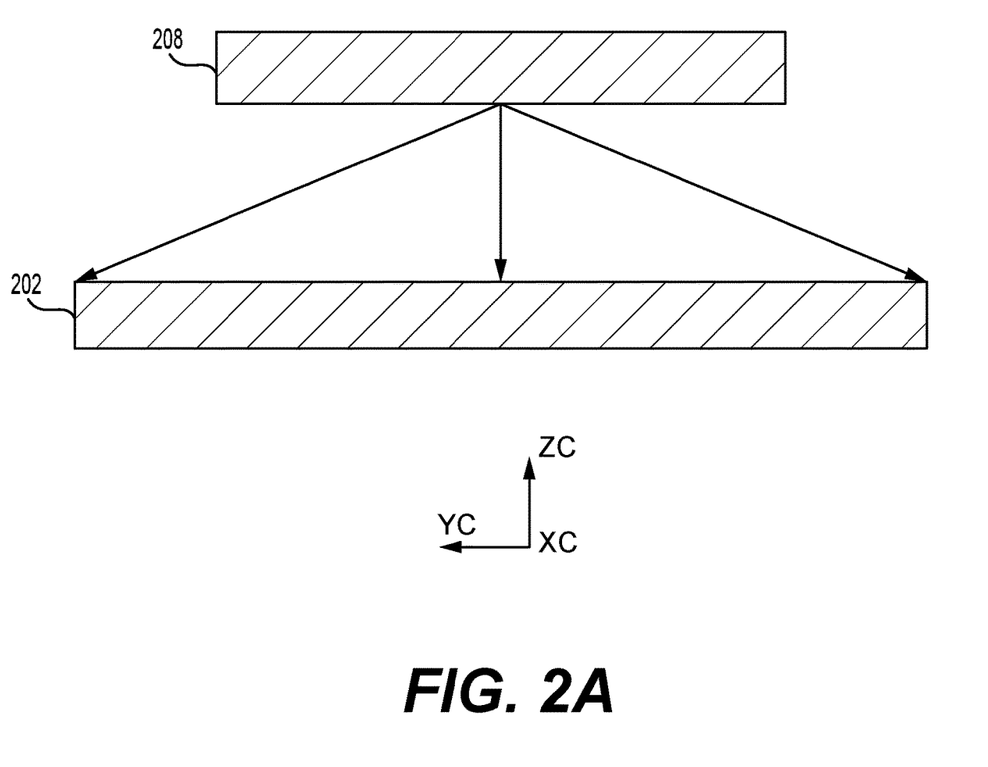
FIG. 2A depicts an exemplary power module and a multi-functional inverter structural element, according to one or more embodiments.

The MFSE 202 may be made of metal such as copper, aluminum, different types of alloy, sheet metal parts, or a diecast part. The MFSE may configured to provide shielding of the PCB 206 from the power module 208. For example, the material of the MFSE 202 may not allow for electromagnetic fields to pass through the MFSE 202. FIG. 2A depicts an exemplary power module and a multi-functional inverter structural element, according to one or more embodiments. FIG. 2A may display the geometric relationship of the power module 208 and the MFSE 202.

For example, the cross section of the MFSE 202 in the XC, YC plane may be greater than the cross section of the power module 208. The geometric position of the MFSE 202 combined with the greater gross sectional area may completely cover the ZC axis electromagnetic projection from the power module 208 as displayed in FIG. 2A. For example, the gate driver board and control boards of the PCB 206 may not be exposed to the electromagnetic fields from components of the power module 208.

Figure 3:
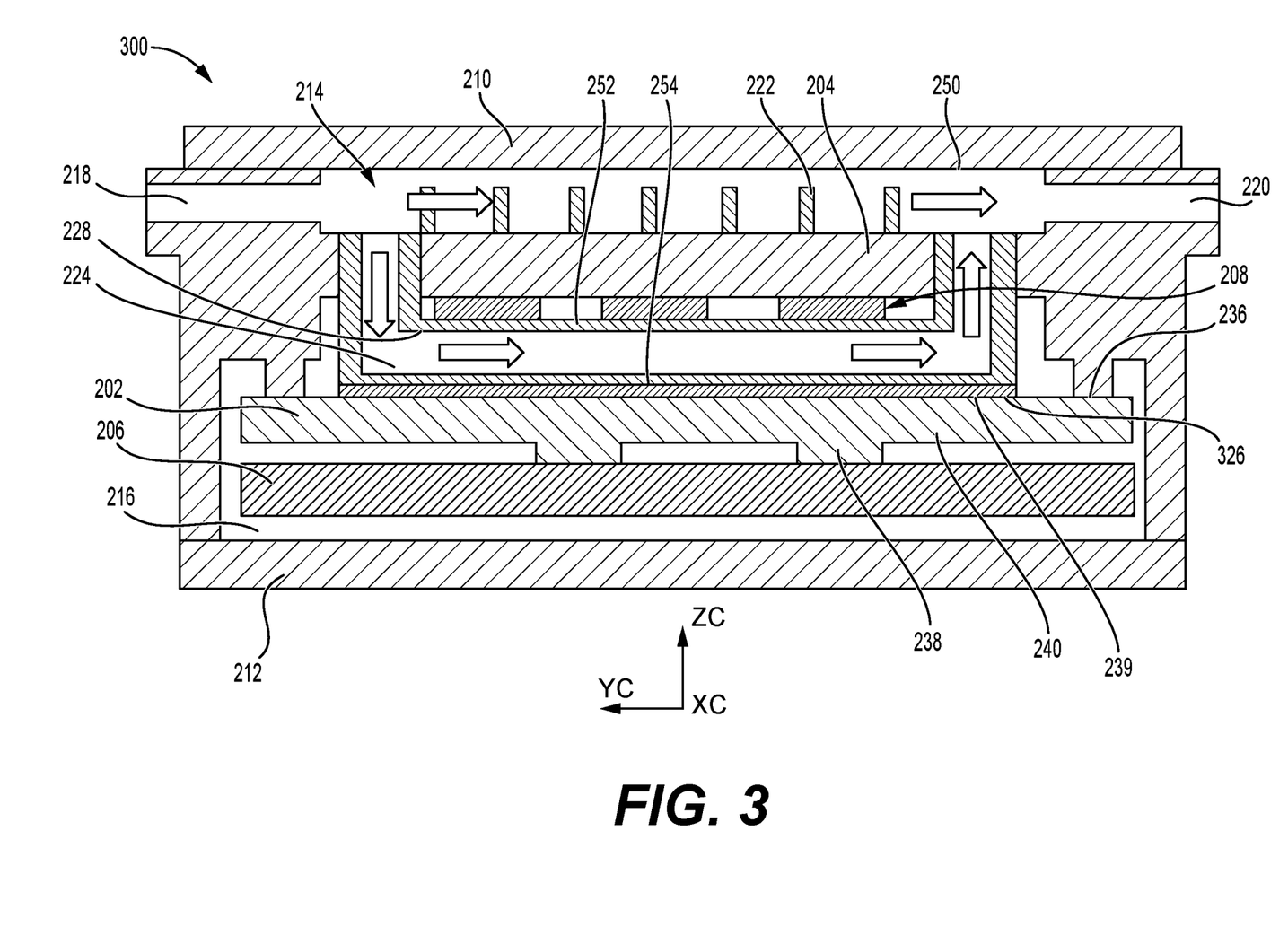
FIG. 3 depicts an exemplary inverter package including a multi-functional inverter structural element connected to a heat sink by a thermal interface material, according to one or more embodiments.

FIG. 3 depicts an exemplary inverter package 300 including a multi-functional inverter structural element (MFSE) 202 connected to a heat sink 228 by a thermal interface material (TIM) 326, according to one or more embodiments. TIM 326 may be located between the second surface 254 of the heat sink 228 and the MFSE 202. The TIM 326 may include epoxy, silicon, or other elastomer products, for example. The TIM 326 may be provided as a dielectric pad, heat spreader, thermal compound, thermal gel (e.g., dispensable gel), thermal tape, phase change material, gap pad, thermal grease, or alternative thermal material, for example. An advantage of the inverter package 300 with TIM 326 is that the MFSE may be a stronger and/or more durable connection. The elements described above in FIG. 3 may be similar to corresponding elements described in FIG. 2 in structure and function.

FIG. 4A depicts an exemplary inverter package 400A including a multi-functional inverter structural element ("MFSE") 202 connected to a sheet metal heat sink 428A by welding, according to one or more embodiments. The sheet metal heat sink 428A may define the second side cooling channel 224. The sheet metal heat sink 428A may be connected to the power module 208 at a first surface, the first surface being located closest to the power module 208. A second surface of the sheet metal heat sink 428A located closest to the PCB 206 may be received by the MFSE 202. The elements described above in FIG. 4A may be similar to corresponding elements described in FIG. 2 in structure and function. The sheet metal heat sink 428A may have a greater performance (e.g., thermal conductivity, and/or durability) than the diecast heat sink 428B depicted in FIG. 4B. The inverter package 400A with the sheet metal heat sink 428A may have a greater thermal conductivity efficiency by utilizing a welding connecting between the MFSE 202 and the sheet metal heat sink 428A in comparison to utilizing TIM 326 for the connection (e.g., as utilized in FIG. 4C).

FIG. 4B depicts an exemplary inverter package 400B including a multi-functional inverter structural element ("MFSE") 202 connected to a diecast heat sink 428B by a seal and screws, according to one or more embodiments. The connection between the MFSE 202 and diecast heat sink 428B may be located at fixation point 542 (shown in FIG. 5) (e.g., one or more fixation points 542, e.g., eight fixation points 542). The diecast heat sink 428B may define the second side cooling channel 224. The diecast heat sink 428B may be connected to the power module 208 at a first surface, the first surface being located closest to the power module 208. This coupling may be performed by one or more types of TIM materials (e.g., soft TIM such as thermal paste or grease, e.g., hard TIM such as soldering or sintering). Opposite of the first surface, may be a second surface that includes an opening. The second surface of the diecast heat sink 428B on the side located closest to the PCB 206 may be received and coupled to the MFSE 202. This coupling may occur at the edge of the first plane 544 (not shown). The connection may include a seal 432 that is received within the second surface of the diecast heat sink 428B. In inverter package 400B, a portion of the MFSE 202 (e.g., the first plane 544 shown in FIG. 5) may define a portion (e.g., a face) of the second side-cooling channel 224. elements described above in FIG. 4B may be similar to corresponding elements described in FIG. 2 in structure and function.

FIG. 4C depicts an exemplary inverter package 300 including a multi-functional inverter structural element ("MFSE") 202 connected to a sheet metal heat sink 428A by a thermal interface material ("TIM") 326, according to one or more embodiments. The sheet metal heat sink 428A may be connected to the power module 208 at a first surface, the first surface being located closest to the power module 208, by a TIM 326. The TIM 326 may be soft TIM such as thermal paste or grease or a hard TIM such as soldering or sintering. A second surface of the sheet metal heat sink 428A located closest to the PCB 206 may be received by the MFSE 202. The elements described above in FIG. 4C may be similar to corresponding elements described in FIG. 2 in structure and function.

Figure 5:
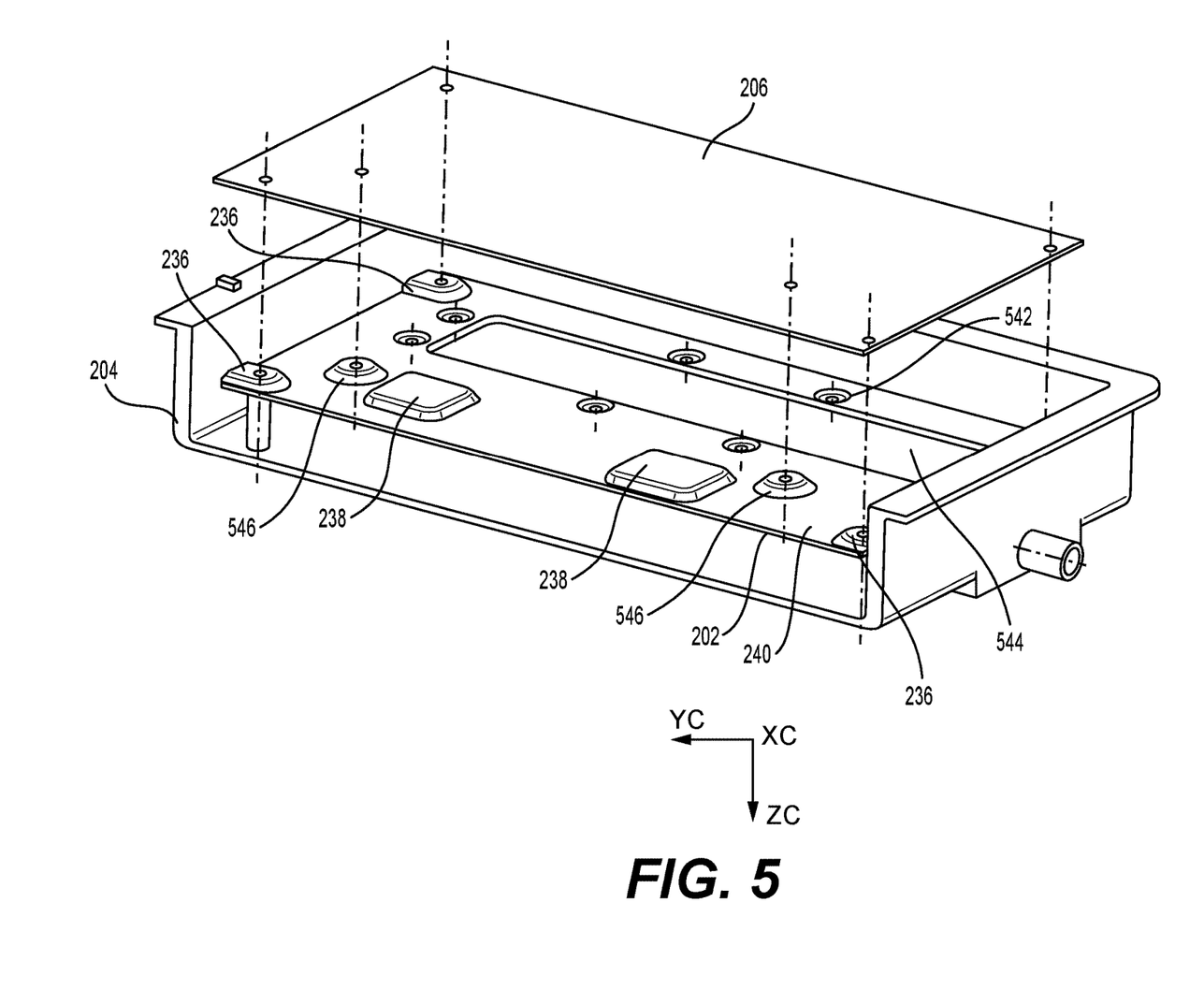
FIG. 5 depicts an exemplary multi-functional inverter structural element in a housing, according to one or more embodiments.

FIG. 5 depicts an exemplary multi-functional inverter structural element ("MFSE") 202 in an inverter housing 204, according to one or more embodiments. The MFSE 202 may contain a first surface (not shown in FIG. 5) and a second surface 240 opposite to the first surface in the ZC axis. The MFSE 202 may include fixation points 542, fixation points 236, fixation points 546, a first plane 544, and a second plane 238 (e.g., two second planes). The second side cooling channel 224 may be located in a heat sink 228 (not shown) connected to the MFSE 202 at the first surface (not shown). The connection may be performed using a fixation point 542. The fixation point 542 may include a thread configured to receive a screw to securely fix the heat sink 228 to the MFSE 202. For example, the MFSE 202 may include eight fixation points 542. Two fixation points 542 may be located adjacent to each side of the first plane 544. The connection of the MFSE 202 and heat sink 228 may further be performed by a hermetic seal between the MFSE 202 and heat sink 228. The connection of the MFSE 202 and heat sink 228 may further be performed by TIM 326 (not shown).

As discussed above, the second surface 240 of the MFSE 202 may be configured to receive the PCB 206. The second surface 240 may be secured to the PCB 206 at fixation point 236 and fixation points 546. For example, the MFSE 202 may include a fixation point 236 located at each corners of the XC-YX plane along the second surface 240 of the MFSE 202. Fixation point 236 may include a thread configured to receive a screw to securely fix the MFSE 202 to the PCB 206 and inverter housing 204. MFSE may include a fixation point 546 located next to each second plane 238. The fixation point 546 may include a thread configured to receive a screw to securely fix the MFSE 202 to the PCB 206.

The MFSE 202 may further including first plane 544. The first plane 544 may transfer heat from the MFSE 202 to the heat sink 228.

The second surface 240 of the MFSE 202 may further contact the PCB 206 at a second plane 238. The second plane 238 may protrude from the second surface of the MFSE 202. For example, the second plane 238 may include two second planes 238. The second plane 238 may be capable of receiving heat from the PCB 206 (not shown) and transferring the heat through the MFSE 202 to the heat sink 228. The second planes 238 may be positioned so as to contact elements from the PCB 206 that require extra cooling. For example, this may performed by transfer of heat from the PCB 206 (not shown), through second plane 238, to a first plane 544 through the first plane 544 (in the ZC axis direction) to the heat sink 228, to the second side cooling channel 224. In some examples, the coolant does not directly contact the MFSE 202. In other examples (as shown in FIG. 4B), the coolant may contact the MFSE 202. In some examples, the coolant may contact only the inner surface of inlet 218, the inner surface of inverter housing 204, the inner surface of heat sink 228, the portion 250 of the first cover 210, and the inner surface of outlet 220.

FIG. 2 depicts an exemplary inverter package 200 cooling circuit 214, according to one or more embodiments. The arrows located within the cooling circuit 214 may indicate the flow of coolant through the cooling circuit 214. Coolant may enter the cooing circuit through inlet 218. Coolant may proceed to flow through the first side cooling channel 222 and through the second side cooling channel 224, following the flow path of the arrows. The coolant may flow from inlet 218, in the YC axis direction across the first side cooling channel 222 and out through the outlet 220. Coolant may also, after entering through inlet 218 and entering the first side cooling channel 222, flow substantially perpendicular to the first side cooling channel 222 in the ZC axis to enter the second side cooling channel 224. Coolant may then flow in the YC axis direction across the second side cooling channel 224 and then flow substantially perpendicular to the second side cooling channel 224 in the YC axis and merge with the first side cooling channel 222. As coolant flows through the cooling circuit, heat may flow from the inverter housing 204, power module 208, PCB 206, and heat sink 228 (not shown) into the coolant. The heated coolant may then be expelled from the cooling circuit 214 through outlet 220.

One or more embodiments may include an MFSE configured to dissipate heat from the active components (e.g., power supplies, active discharge, gate drivers) from the control and gate driver boards of the PCB. One or more embodiments may include an MFSE to provide structural support within an inverter system and allow for a secure connection of the PCB within the inverter system. One or more embodiments may include an MFSE configured to provide electromagnetic shielding of PCB components from the power module.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:
1. An inverter comprising:
  a housing including a first surface and a second surface opposite to the first surface;

a power module including a first surface and a second surface opposite to the first surface, wherein the first surface of the power module contacts the first surface of the housing;

a heat sink including a first surface and a second surface opposite to the first surface, wherein the first surface of the heat sink is coupled to the second surface of the power module;

a multi-functional structural element, the multi-functional structural element including a first surface and a second surface opposite to the first surface, wherein the first surface of the multi-functional structural element contacts the second surface of the heat sink; and a printed circuit board, the printed circuit board being coupled to the second surface of the multi-functional structural element;

wherein the housing and heat sink define a cooling circuit, the cooling circuit including a first cooling channel and a second cooling channel, the first cooling channel being defined by a space in the housing and the second cooling channel being defined by inner walls of the heat sink.

2. The inverter of claim 1, wherein the multi-functional structural element is coupled to the heat sink by a thermal interface material.

3. The inverter of claim 1, wherein the multi-functional structural element is coupled to the heat sink by a hermetic seal.

4. The inverter of claim 1, wherein the multi-functional structural element is metal.

5. The inverter of claim 1, wherein the multi-functional structural element does not directly contact the cooling circuit.

6. The inverter of claim 1, wherein the heat sink is a diecast heat sink or sheet metal heat sink.

7. The inverter of claim 1, wherein the multi-functional structural element includes a first plane, the first plane being a recess within the first surface of the multi-functional structural element, the recess being configured to receive the heat sink.

8. The inverter of claim 1, wherein an air gap exists between the printed circuit board and an external cover of the housing.

9. The inverter of claim 1, wherein the multi-functional structural element includes a fixation point capable of receiving a screw, the screw being configured to secure the printed circuit board and the multi-functional structural element to the housing.

10. The inverter of claim 1, wherein the multi-functional structural element has a geometric cross section greater than the power module.

11. The inverter of claim 10, wherein the multi-functional structural element is configured to completely cover the printed circuit board from an electromagnetic field projected from the power module.

12. The inverter of claim 1, wherein the multi-functional structural element includes a second plane that protrudes from the second surface of the multi-functional structural element and contacts the printed circuit board, wherein the second plane is configured to receive heat from the printed circuit board.

13. An inverter comprising:
a housing including a first surface and a second surface opposite to the first surface;

a power module including a first surface and a second surface opposite to the first surface, wherein the first surface of the power module contacts the first surface of the housing;

a heat sink including a first surface and a second surface opposite to the first surface, wherein the first surface of the heat sink is coupled to the second surface of the power module;

a multi-functional structural element, the multi-functional structural element including a first surface and a second surface opposite to the first surface, wherein the first surface of the multi-functional structural element contacts an outer wall of the heat sink, wherein the multi-functional structural element has a geometric cross section greater than the power module; and a printed circuit board, the printed circuit board being coupled to the second surface of the multi-functional structural element, wherein the multi-functional structural element is configured to completely cover the printed circuit board from an electromagnetic field projected from the power module;

wherein the housing and the heat sink define a cooling circuit, the cooling circuit including a first cooling channel and a second cooling channel, the first cooling channel being defined by a space in the housing and the second cooling channel being defined by inner walls of the heat sink.

14. The inverter of claim 13, wherein the multi-functional structural element is coupled to the heat sink by a thermal interface material.

15. The inverter of claim 13, wherein the multi-functional structural element is coupled to the heat sink by a hermetic seal.

16. The inverter of claim 13, wherein the multi-functional structural element is metal.

17. The inverter of claim 13, wherein the multi-functional structural element does not directly contact the cooling circuit.

18. The inverter of claim 13, wherein the multi-functional structural element includes a first plane, the first plane being a recess within the first surface of the multi-functional structural element, the recess being configured to receive the heat sink.

19. The inverter of claim 13, wherein the multi-functional structural element includes a second plane that protrudes from the second surface of the multi-functional structural element and contacts the printed circuit board, wherein the second plane is configured to receive heat from the printed circuit board.

20. A multi-functional structural element for an inverter, the element comprising:
a first plane with a first surface and a second surface opposite to the first surface, the multi-functional structural element further including a second plane and a third plane, the second plane being a rectangular recess within the first surface of the first plane, the second plane being configured to receive and transfer heat to a heat sink, the third plane being a protrusion from the second surface of the first plane, the third plane being configured to contact a printed circuit board and configured to transfer heat from the printed circuit board to the first plane.

* * * * *

UNITED STATES PATENT AND TRADEMARK OFFICE
CERTIFICATE OF CORRECTION

| | | |
|---|---|---|
| PATENT NO. | : 12,408,309 B2 | Page 1 of 1 |
| APPLICATION NO. | : 18/334199 | |
| DATED | : September 2, 2025 | |
| INVENTOR(S) | : Andreas Apelsmeier, Chetan Ugare and Stefan Berindan | |

It is certified that error appears in the above-identified patent and that said Letters Patent is hereby corrected as shown below:

On the Title Page

Column 1, at Line 1 of item (71), Applicant, delete "Technologies" and insert --Technologies,--.

Signed and Sealed this
Fourteenth Day of October, 2025

John A. Squires
*Director of the United States Patent and Trademark Office*